United States Patent
Ho (10) Patent No.: US 10,834,836 B1
(45) Date of Patent: Nov. 10, 2020

(54) ELECTRICAL FACILITY FOR ATTACHING TO A SUPPORT DEVICE

(71) Applicant: Oxti Corporation, Taipei (TW)

(72) Inventor: Chih Feng Ho, Taipei (TW)

(73) Assignee: OXTI CORPORATION, Taipei (TW)

( * ) Notice: Subject to any disclaimer, the term of this patent is extended or adjusted under 35 U.S.C. 154(b) by 0 days.

(21) Appl. No.: 16/438,718

(22) Filed: Jun. 12, 2019

(51) Int. Cl.
*H05K 5/02* (2006.01)
*H05K 5/03* (2006.01)

(52) U.S. Cl.
CPC ......... *H05K 5/0204* (2013.01); *H05K 5/0221* (2013.01); *H05K 5/0247* (2013.01); *H05K 5/03* (2013.01)

(58) Field of Classification Search
CPC .. H05K 5/0204; H05K 5/0221; H05K 5/0247; H05K 5/03
See application file for complete search history.

(56) References Cited

U.S. PATENT DOCUMENTS

| | | | |
|---|---|---|---|
| 5,713,549 A | 2/1998 | Shieh | |
| 6,053,586 A * | 4/2000 | Cook | E05B 65/006 292/146 |
| 6,769,657 B1 | 8/2004 | Huang | |
| 7,395,995 B2 | 7/2008 | Chen | |
| 9,985,396 B1 * | 5/2018 | Ho | H01R 13/73 |
| 10,531,733 B1 * | 1/2020 | Ho | A47B 23/02 |
| 2013/0075564 A1 * | 3/2013 | Ho | F16B 2/12 248/316.4 |
| 2013/0075565 A1 * | 3/2013 | Ho | F16B 2/12 248/316.4 |
| 2016/0102806 A1 * | 4/2016 | Ho | F16M 13/022 248/292.14 |
| 2018/0100618 A1 * | 4/2018 | Ho | F16B 2/12 |
| 2019/0394889 A1 * | 12/2019 | Wu | H05K 5/0221 |

* cited by examiner

*Primary Examiner* — Hanh V Tran
(74) *Attorney, Agent, or Firm* — Browdy and Neimark, PLLC (57) ABSTRACT

An electrical facility for a supporting device includes a housing having a chamber formed in the housing, the housing includes an opening formed in the housing and defined between two side edges, a lock member includes one or more lock pins extended from the lock member for engaging with the housing and for locking the lock member to the housing, and a cover is engaged with the lock member and the housing. The housing includes a lock element formed in each of the side edges of the housing for receiving and engaging with the lock pin. The lock member includes a protrusion extended from the lock member for engaging with a slot of the cover and for anchoring the cover to the lock member and the housing.

4 Claims, 8 Drawing Sheets

ELECTRICAL FACILITY FOR ATTACHING TO A SUPPORT DEVICE

BACKGROUND OF THE INVENTION

1. Field of the Invention

The present invention relates to an electrical facility, and more particularly to an electrical facility including an improved structure or configuration for allowing the electrical facility to be easily and quickly and readily attached or mounted or secured to a clamp or support device that may be used for attaching or mounting or securing to a supporting desk or the like.

2. Description of the Prior Art

Typical electrical facilities, such as displays, monitors, notebooks, portable or mobile phones, iPads or the like may be required to be attached or mounted or secured to a supporting desk or the like with a clamping device or supporting device which comprises a screw clamp for engaging with the supporting desk or the like and for attaching or mounting or securing the clamping or supporting device and the electrical facilities to the supporting desk or the like.

For example, U.S. Pat. No. 5,713,549 to Shieh, U.S. Pat. No. 6,769,657 B1 to Huang, and U.S. Pat. No. 7,395,995 to Chen disclose several of the typical clamping devices or supporting devices for attaching or mounting or securing the electrical facilities to the supporting desk or the like.

However, the typical clamping devices or supporting devices includes a complicated structure or configuration that may not be easily and quickly made or manufactured and that may include a large number of parts and elements for attaching or mounting or securing the electrical facilities to the clamping devices or supporting devices, and that may include a complicated making or manufacturing procedure, and that may include a greatly increased manufacturing cost.

The present invention has arisen to mitigate and/or obviate the afore-described disadvantages of the conventional electrical facilities.

SUMMARY OF THE INVENTION

The primary objective of the present invention is to provide an electrical facility including an improved structure or configuration for allowing the electrical facility to be easily and quickly and readily attached or mounted or secured to a clamp or support device that may be used for attaching or mounting or securing to a supporting desk or the like.

In accordance with one aspect of the invention, there is provided an electrical facility for a supporting device comprising a housing including a chamber formed in the housing, the housing including an opening formed in the housing and defined between two side edges, a lock member including at least one lock pin extended therefrom for engaging with the housing and for locking the lock member to the housing, and a cover engaged with the lock member and the housing.

The housing includes a lock element formed in each of the side edges of the housing for receiving or engaging with the lock pin.

The cover includes a slot formed in the cover. The lock member includes a protrusion extended from the lock member for engaging with the slot of the cover and for anchoring the cover to the lock member and the housing.

The housing includes a plurality of connectors provided in the housing. The housing includes at least one flap extended from the housing. The cover includes a notch formed in the cover.

Further objectives and advantages of the present invention will become apparent from a careful reading of the detailed description provided hereinbelow, with appropriate reference to the accompanying drawings.

DETAILED DESCRIPTION OF THE PREFERRED EMBODIMENT

Figure 1:
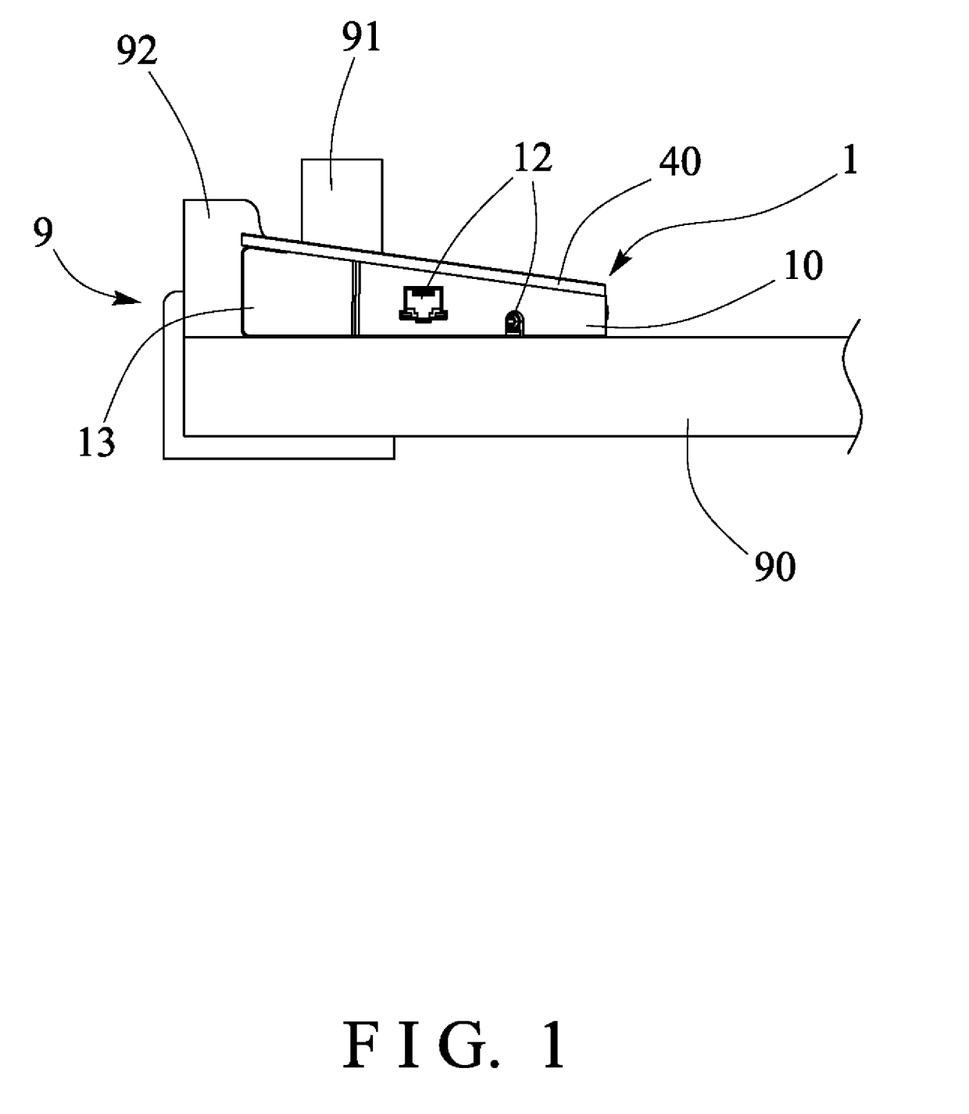
FIG. 1 is a side plan schematic view illustrating the attachment of an electrical facility in accordance with the present invention to a supporting desk or the like with a clamping device or supporting device.
Figure 2:
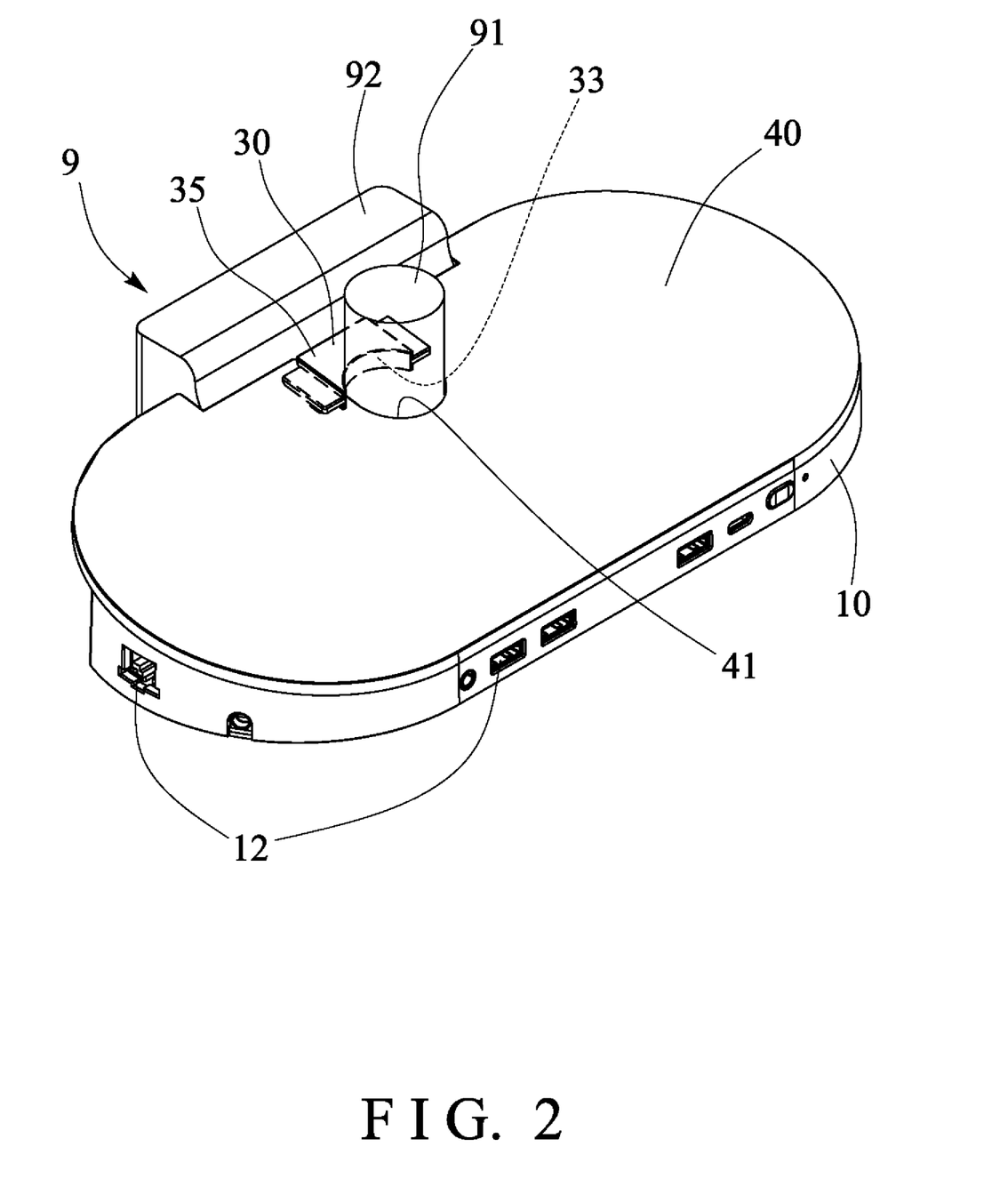
FIG. 2 is a perspective view of the electrical facility and the clamping device or supporting device.
Figure 3:
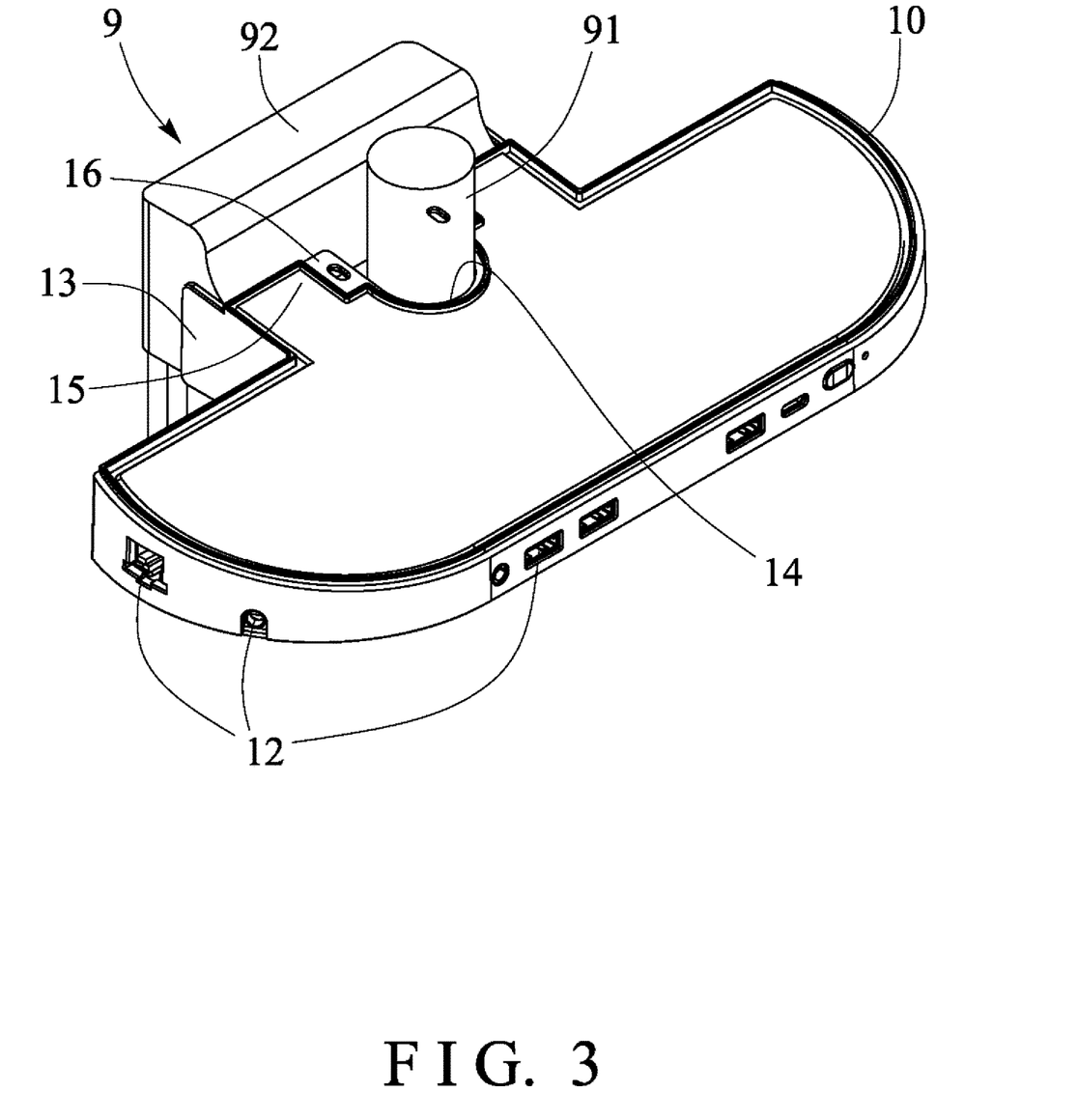
FIGS. 3, 4 are perspective views similar to FIG. 2, illustrating the operation of the electrical facility.
Figure 4:
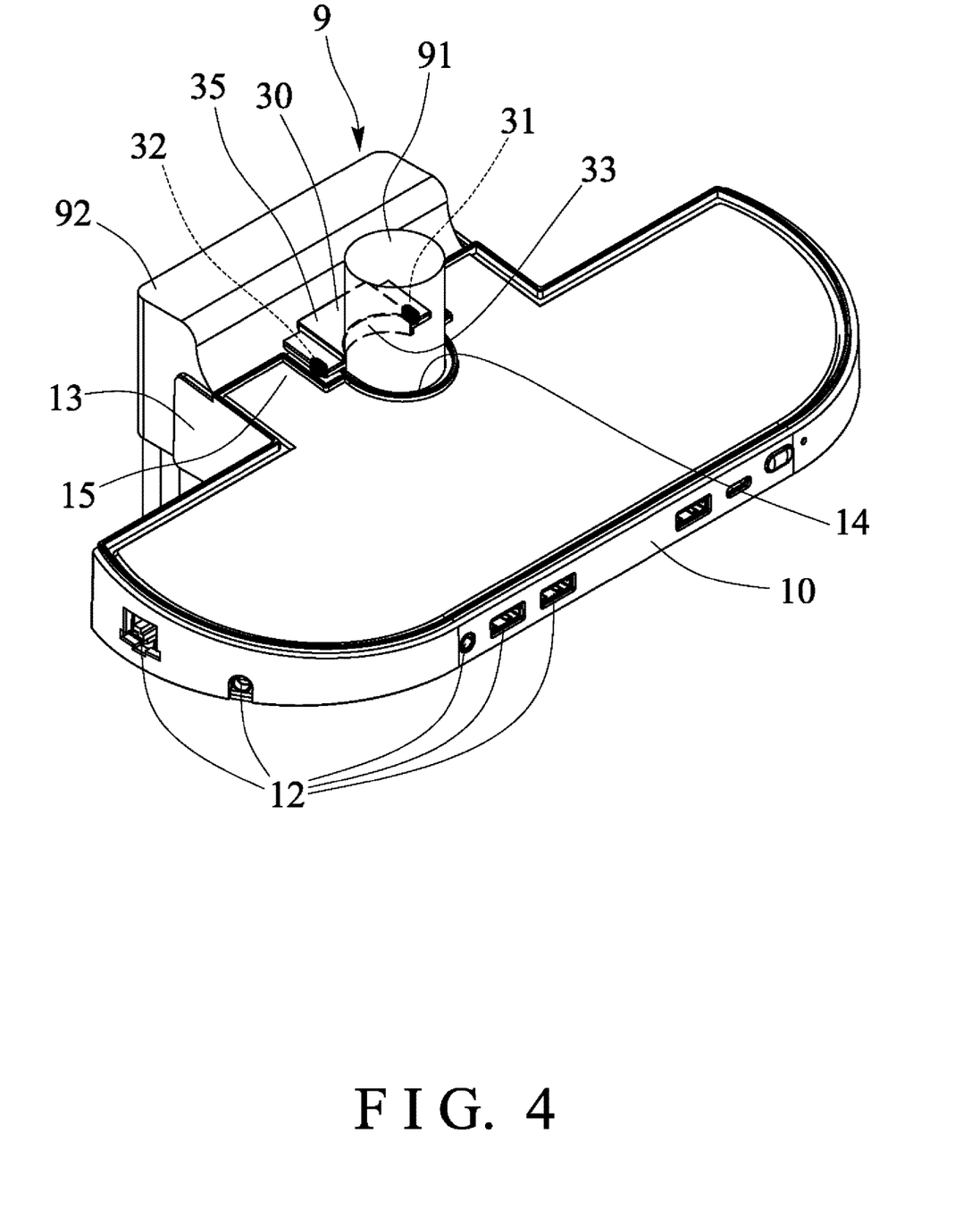

Referring to the drawings, and initially to FIGS. 1 and 2, an electrical facility 1 in accordance with the present invention comprises an electrical facility body member or housing 10 for attaching or mounting or securing to a supporting desk 90 or object or the like with a clamping device or supporting device 9 which normally includes a pole or stud 91 formed or provided thereon or extended therefrom for engaging with and for attaching or mounting or securing the electrical facility 1 to the supporting desk 90 or object or the like. The electrical facility 1 may be selected from a display, a monitor, a notebook, a portable or mobile phone, an iPad, a calculator, a keyboard, a remote control device or the like and may be provided for attaching to the supporting desk 90 with the supporting device 9.

Figure 5:
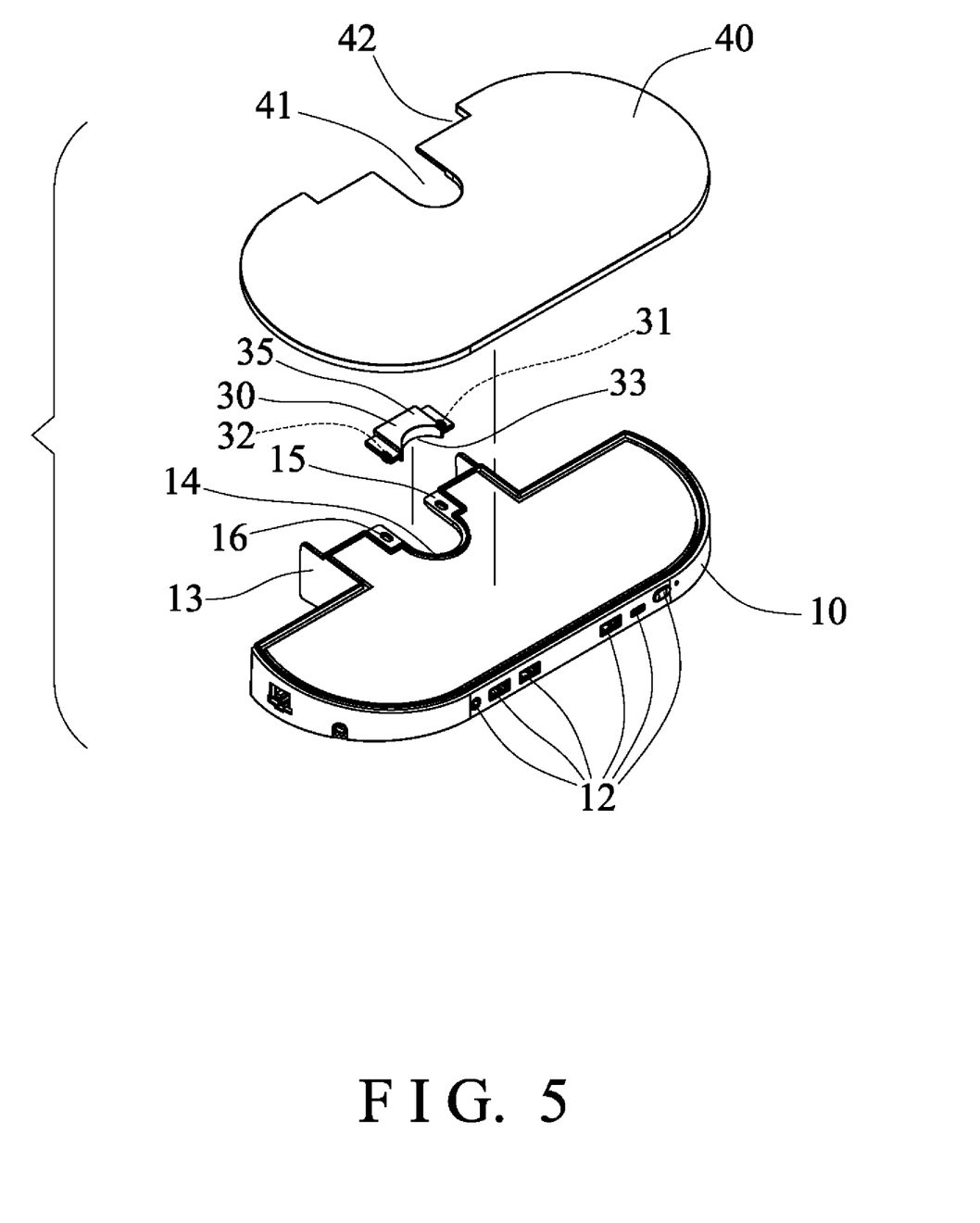
FIG. 5 is a partial exploded view of the electrical facility as seen from the front and upper portion of the electrical facility.
Figure 6:
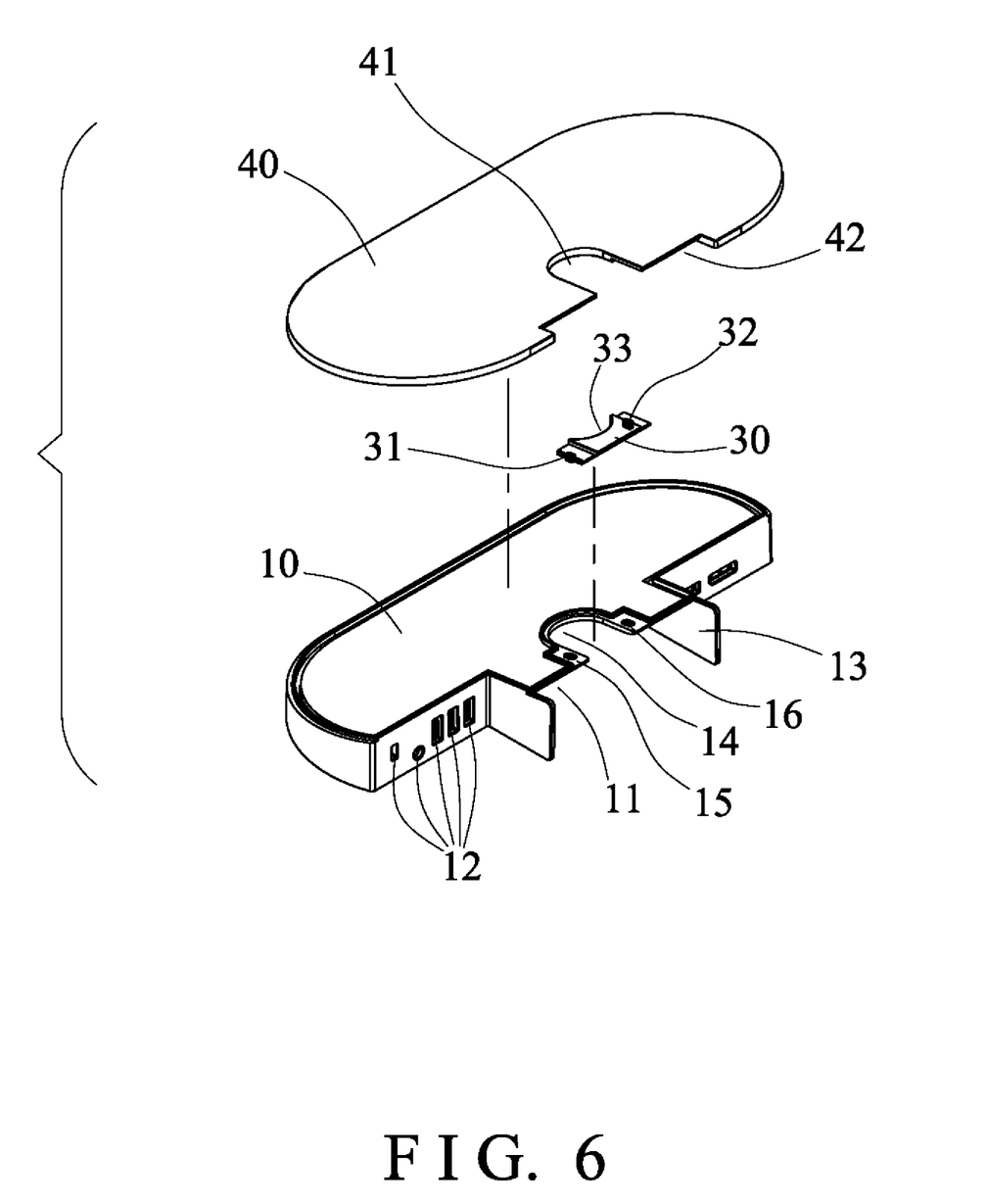
FIG. 6 is another partial exploded view as seen from the rear and upper portion of the electrical facility.
Figure 7:
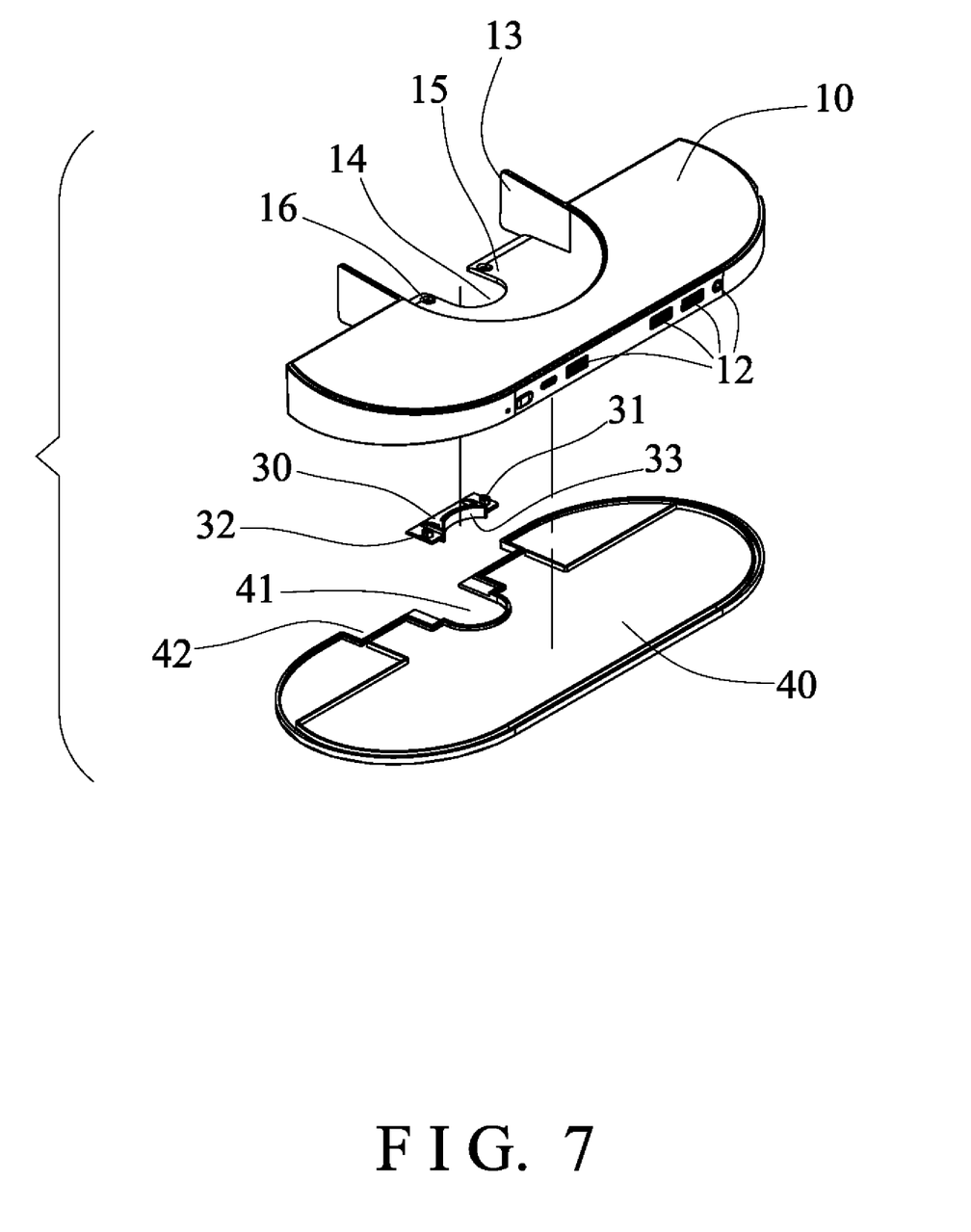
FIG. 7 is a further partial exploded view as seen from the front and bottom portion of the electrical facility.

As shown in FIGS. 5-7, the housing 10 of the electrical facility 1 includes a compartment or chamber 11 formed therein (FIG. 6) for receiving or engaging with a portion, such as a base anchor 92 of the supporting device 9, and includes a number of sockets or terminals or connectors 12 formed or provided thereon for electrically connecting or coupling to various electrical devices or appliances, and includes one or more (such as two) ears or flaps 13 extended therefrom for engaging with the base anchor 92 of the supporting device 9 and for solidly and stably anchoring or retaining or positioning the housing 10 to the supporting device 9 and for preventing the housing 10 from moving sidewise relative to the supporting device 9.

The housing 10 further includes an oblong hole or opening 14 formed therein and formed or defined between two sides or side edges 15, and/or communicating with the chamber 11 of the housing 10, and for receiving or engaging with the stud 91, best shown in FIGS. 1-4 and for further solidly and stably anchoring or retaining or positioning the housing 10 to the supporting device 9. The housing 10 further includes one or more (such as two) lock orifices or lock elements 16 formed therein, such as formed in the side edges 15 thereof respectively. The electrical facility 1 further includes a fastener or lock member 30 attached or mounted or secured to the housing 10 and contacted or engaged with the stud 91 of the supporting device 9 for further solidly and stably anchoring or retaining or positioning or locking the housing 10 to the supporting device 9.

Figure 8:
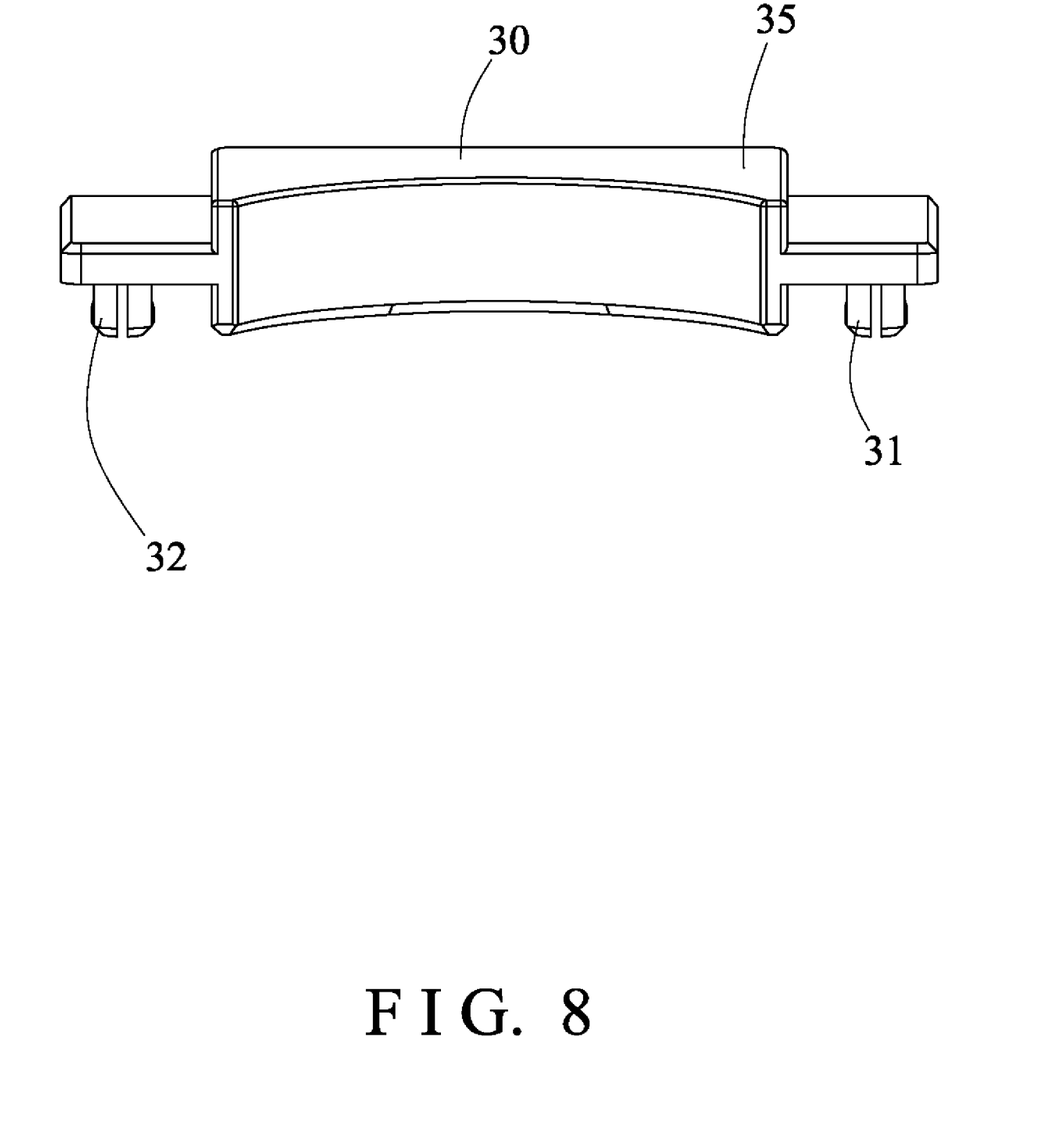
FIG. 8 is an enlarged partial plan schematic view of the electrical facility.

The lock member 30 includes one or more (such as two) lock tongues or lock pins 31, 32 extended therefrom (FIG. 8) for engaging with the lock elements 16 of the housing 10 and for locking or securing the lock member 30 to the housing 10 and also for solidly and stably anchoring or retaining or positioning or locking the housing 10 to the stud 91 of the supporting device 9. It is preferable, but not necessary that the lock member 30 includes a curved recess 33 formed therein for suitably engaging with the stud 91 that includes a cylindrical shape or structure or configuration having a circular cross section. The curved recess 33 of the lock member 30 and the opening 14 of the housing 10 may include a circular shape or cross section for suitably receiving or engaging with the stud 91.

The electrical facility 1 further includes a cap or cover 40 for engaging onto the housing 10, and the cover 40 also includes an oblong hole or slot 41 formed therein for receiving or engaging with the stud 91 (FIG. 2), and a notch 42 formed therein for engaging with the base anchor 92 of the supporting device 9 and for solidly and stably anchoring or retaining or positioning the cover 40 to the housing 10 and the supporting device 9. The lock member 30 may further include a bulge or protrusion 35 extended therefrom for engaging with the slot 41 of the cover 40 (FIG. 2) and for further solidly and stably anchoring or retaining or positioning the cover 40 to the lock member 30 and the housing 10. The cover 40 may be solidly and stably attached or mounted or secured to the housing 10 with screws or bolts or catches or latches or fasteners (not illustrated) or with welder or adhesive materials or the like, for partially covering the lock member 30 and for covering and shielding the housing 10.

Accordingly, the electrical facility in accordance with the present invention includes an improved structure or configuration for allowing the electrical facility to be easily and quickly and readily attached or mounted or secured to a clamp or support device that may be used for attaching or mounting or securing to a supporting desk or the like.

Although this invention has been described with a certain degree of particularity, it is to be understood that the present disclosure has been made by way of example only and that numerous changes in the detailed construction and the combination and arrangement of parts may be resorted to without departing from the spirit and scope of the invention as hereinafter claimed.

I claim:

1. An electrical facility for a supporting device comprising:
    a housing including a chamber formed in said housing, said housing including an opening formed in said housing and defined between two side edges, said housing including a lock element formed in each of said side edges of said housing, said housing including at least one electric connector provided in said housing,
    a stud engaged in said opening of said housing and engaged between said side edges of said housing,
    a lock member including at least one lock pin extended therefrom for engaging with said lock element of said housing and for locking said lock member to said housing, said lock member being contacted and engaged with an exterior surface of said stud for retaining said stud between said housing and said lock member and for confining said stud in said opening of said housing, and
    a cover engaged with said lock member and said housing, said cover including a slot formed in said cover for receiving and engaging with the stud.

2. The electrical facility as claimed in claim 1, wherein said lock member includes a protrusion extended from said lock member for engaging with said slot of said cover and for anchoring said cover to said lock member and said housing.

3. The electrical facility as claimed in claim 1, wherein said housing includes at least one flap extended from said housing.

4. The electrical facility as claimed in claim 1, wherein said cover includes a notch formed in said cover.

\* \* \* \* \*